(12) United States Patent
Morton et al.

(10) Patent No.: US 8,724,739 B2
(45) Date of Patent: May 13, 2014

(54) VARIABLE PHASE SHIFTER-ATTENUATOR

(75) Inventors: Matthew A. Morton, Reading, MA (US); Jonathan P. Comeau, Winchester, MA (US); Edward W. Thoenes, Cambridge, MA (US)

(73) Assignee: Raytheon Company, Waltham, MA (US)

( * ) Notice: Subject to any disclaimer, the term of this patent is extended or adjusted under 35 U.S.C. 154(b) by 804 days.

(21) Appl. No.: 12/942,496

(22) Filed: Nov. 9, 2010

(65) Prior Publication Data

US 2012/0114076 A1     May 10, 2012

(51) Int. Cl.
*H04L 27/20* (2006.01)

(52) U.S. Cl.
USPC ....................................... 375/308

(58) Field of Classification Search
USPC ....................................... 375/308
See application file for complete search history.

(56) References Cited

U.S. PATENT DOCUMENTS

| | | | | |
|---|---|---|---|---|
| 2,995,699 | A * | 8/1961 | Snelling et al. | 324/330 |
| 3,663,833 | A * | 5/1972 | Pao et al. | 327/347 |
| 5,504,493 | A * | 4/1996 | Hirshfield | 342/372 |
| 6,084,545 | A * | 7/2000 | Lier et al. | 342/360 |
| 6,133,791 | A | 10/2000 | Horiguchi et al. | |
| 6,473,019 | B1 * | 10/2002 | Ruha et al. | 341/143 |
| 2005/0207509 | A1 | 9/2005 | Saunders et al. | |
| 2006/0006950 | A1 | 1/2006 | Burns et al. | |
| 2007/0046371 | A1 | 3/2007 | Barabash et al. | |
| 2007/0152751 | A1 | 7/2007 | Do et al. | |
| 2007/0182481 | A1* | 8/2007 | Wu et al. | 330/54 |
| 2009/0017211 | A1 | 1/2009 | Gruner et al. | |

FOREIGN PATENT DOCUMENTS

WO    WO 2007/044595 A2    4/2007

OTHER PUBLICATIONS

Notification of Transmittal of the International Search Report and the Written Opinion of the International Searching Authority, or the Declaration, PCT/US2011/055195 date of mailing Nov. 17, 2011, 4 pages.

Written Opinion of the International Searching Authority, PCT/US2011/055195 date of mailing Nov. 17, 2011, 6 pages.

Invitation to Pay Additional Fees and, Where Applicable, Protest Fees, PCT/US2011/055197, pp. 1-6.

(Continued)

*Primary Examiner* — Shuwang Liu
*Assistant Examiner* — Nader Bolourchi
(74) *Attorney, Agent, or Firm* — Daly, Crowley, Mofford & Durkee, LLP

(57) ABSTRACT

A phase shifter-attenuator system having: a controller for producing a digital word representative of a predetermined phase shift and attenuation provided to an input signal; and a phase shifter-attenuation section. The phase shifter-attenuation section includes: a phase rotator for providing one of a plurality combinations of phase shifts-attenuation states to the input signal selectively in accordance with one portion of the produced digital word; and an attenuation section for distributing the plurality of combinations of phase shift-attenuation states over a selected range of attenuations, such range being selected in accordance with a second portion of the produced digital word. The phase shifter-attenuator section provides one of a plurality of combinations of phase shift-attenuation states to the input signal selectively in accordance with one portion of the produced digital word, the combinations being distributed over a range of attentions selected in accordance with a second portion of the digital word.

3 Claims, 10 Drawing Sheets

(56) References Cited

OTHER PUBLICATIONS

Notification Concerning Transmittal of Copy of International Preliminary Report on Patentability (Chapter I of the Patent Cooperation Treaty) dated May 23, 2013, PCT/US2011/055197, 1page.

International Preliminary Report on Patentability dated May 23, 2013, PCT/US2011/055197, 1 page.

Written Opinion of the International Searching Authority, PCT/US2011/055197, 7 pages.

Jeon et al., "A Scalable 6-to-18 GHz Concurrent Dual-Band Quad-Beam Phased-Array Receiver in CMOS", IEEE Journal of Solid-State Circuits, vol. 43, No. 12, Dec. 2008, p. 2660-2673.

Chaudhry et al., "A SiGe MMIC Variable Gain Cascode Amplifier", IEEE Microwave and Wireless Components Letters, vol. 12, No. 11, Nov. 2002, p. 424-425.

Wang et al., "A Wideband CMOS Linear Digital Phase Rotator", IEEE 2007 Custom Integrated Circuits Conference (CICC), 1-4244-1623-X/07/$25 © 2007 IEEE, p. 671-674.

Koh et al., "0.13-μm CMOS Phase Shifters for X-, K$u$-, and K-Band Phased Arrays", IEEE Journal of Solid-State Circuits, vol. 42, No. 11, Nov. 2007, p. 2535-2546.

* cited by examiner

VARIABLE PHASE SHIFTER-ATTENUATOR

TECHNICAL FIELD

This disclosure relates generally to variable phase-shifter-attenuators and more particularly to high-resolution digitally controlled variable phase-shifter attenuators.

BACKGROUND AND SUMMARY

As is known in the art, variable phase-shifter-attenuators have a wide range of applications. One such application is in phased array antennas where the direction and shape of the antenna beam is formed in accordance with the relative phases and attenuations produced across an array of antenna elements by variable phase-shifter-attenuators in the paths passing radio frequency energy between array of antenna elements and the radar system in accordance with control signals produced by a beam steering computer and fed to the phase-shifter-attenuators.

As is also known in the art, it would be desirable to provide digitally controlled variable phase-shifter-attenuators suitable for fabrication as a monolithic microwave integrated circuit (MMIC). One digitally controlled phase shifter is described in a paper entitled "A Wideband CMOS Linear Digital Phase Rotator": by Hug Wang and Ali Hajimiri, IEEE 2007 Custom Integrated Circuit Conference, pages 671-674 (Vol. TP-30, pp. 1-4). In this paper, the phase rotator while proving phase rotation did not provide for variable attenuation. See also papers by K. Koh and G. Rebiez entitled "0.13 μm CMOS Phase Shifters for X-Ku- and K-Band Phased Arrays" IEEE Journal of Solid State Circuits. Vol. 42. No. 11 pp. 2535-2546 (2007) and S. Jeon, Y. Wang, H. Wang, F. Bohn, A Natarajan, A. Babakhani, and A. Hajimiri, "A Scalable 6-to-18 GHz Concurrent Dual-Band Quad-Beam Phased-Array Receiver in CMOS" IEEE Journal of Solid State Circuits, Vol. 43, No. 12. pp. 2660-2677 (2008).

As described in the paper "A Wideband CMOS Linear Digital Phase Rotator": by Hug Wang and Ali Hajimiri, IEEE 2007 Custom Integrated Circuit Conference, pages 671-674, an input signal is separated into a pair of quadrature channels, each channel having n amplifiers of different gain. The input signal in each channel is fed to all n amplifiers. The on-off states of the amplifiers are controlled a digital control word. The outputs of the amplifiers in each of the channels are fed to a common output node. With such an arrangement, a plurality of $2^{(2n)}$ phase shift-attenuation states is produced a Cartesian coordinate system having as the axis thereof the amplitudes of the output signal at one of the common nodes and the amplitudes of the output signal at the other one of the common nodes. The control word selects one of the $2^{(2n)}$ states. The arctangent of the ratio of these two output signals at a selected one of the states is the phase provided to the input signal and the distance from the origin to the selected state is the attenuation provided to the control word.

In accordance with one embodiment, a phase shifter-attenuator system is provided having: a controller for producing a digital word representative of a predetermined phase shift and attenuation provided to an input signal; and a phase rotator for providing one of a plurality combinations of phase shift-attenuation states to the input signal selectively in accordance with one portion of the produced digital word, the plurality of combinations being distributed over a selected range of attenuations, the range being selected in accordance with a second portion of the produced digital word.

In one embodiment, a phase shifter attenuator system, comprises: (A) a controller for producing a digital word representative of a predetermined phase shift and attenuation provided to an input signal; and (B) a phase shifter-attenuation section. The a phase shifter-attenuation section comprises: (a) a phase rotator for providing one of a plurality combinations of phase shift-attenuation states to the input signal selectively in accordance with one portion of the produced digital word; and (b) an attenuation section for distributing the plurality of combinations of phase shift-attenuation states over a selected range of attenuations, such range being selected in accordance with a second portion of the produced digital word.

In one embodiment, the attenuator is a switchable bias circuit for switching an operating point of the phase rotator and in another embodiment the attenuator is a switchable attenuator fed by the phase rotator.

With such an arrangement, while the shifter-attenuator section produces of one of a $2^{(2n)}$ discrete phase shift-attenuation states selectively in response to an 2n bit digital control word, the $2^{(2n)}$ discrete phase shifts are distributed over a selected attenuation range selected in accordance with a second m bit portion of the digital word; such second portion being representative of $2^m$ different ranges. Thus, the $2^{(2n)}$ states may be distributed, for example where m is 1, over a large range of attenuations where a smaller amount of attenuation is selected or over a smaller range of attenuations where a higher degree of attenuation is desired. Thus, a greater number of states are available when larger attenuations are selected than the number of states available when smaller attenuations are selected. To put it another way, phase shifter-attenuator section operates over different selectable dynamic ranges, each range being associated a selected range of attenuations, and the $2^{(2n)}$ discrete phase shift-attenuation states are distributed over each selected dynamic range so that each selected attenuation range has the full $2^{(2n)}$ discrete phase shift-attenuation states.

In one embodiment, a phase shifter-attenuator system is provided having: (A) a quadrature section for converting an input signal into a corresponding pair of quadrature signals with each one pair of quadrature signals having an in-phase component and an out-of-phase component; (B) a controller for producing a digital word representative of a predetermined phase shift and attenuation provided to the input signal; (C) a phase shifter-attenuator section fed by the produced digital word, comprising: (a) a pair of quadrature channels, each one of the channels being fed a corresponding one of the pair of quadrature signals, each one of such channels having: (i) a plurality of amplifiers, each one the amplifiers having a different gain, each one of the amplifiers being fed by the corresponding one of the pair of quadrature signals fed to such one of the channels, the amplifiers in such one of the channels being coupled to an output node; (D) wherein the phase shifter-attenuator section provides one of a plurality combinations of phase shift-attenuation states to the input signal selectively in accordance with one portion of the produced digital word, the combinations being distributed over a selected range from the origin of a four quadrants of a attenuation-phase array, the range being selected in accordance with a second portion of the digital word.

In one embodiment, a phase shifter-attenuator system is provided, comprising: (A) a quadrature section for converting an input signal into a corresponding pair of quadrature signals with each one pair of quadrature signals having an in-phase component and an out-of-phase component; (B) a controller for producing two pairs of n bit digital words and a pair of m bit digital word, where n and m are integers, one of the pairs of n bit digital words being a first word $W_I$ having n bits and the complement of the first digital word, $\overline{W}_I$ having n bits, and the other one of the two pairs of n bit digital words being a second word $W_Q$ having n bits, and the complement of the second word, $\overline{W}_Q$, having n bits, such 2n+m bit digital words being representative of a predetermined phase shift and attenuation provided to the input signal; (C) a phase shifter-attenuator section fed by the two pairs of n bit digital words and a pair of m bit digital word, comprising: (a) a pair of quadrature channels, each one of the channels being fed a corresponding one of the pair of quadrature signals, each one of such channels having: (i) a plurality of n amplifiers, each one the amplifiers having a different gain, each one of the amplifiers being fed by the corresponding one of the pair of quadrature signals fed to such one of the channels, each one of amplifiers in such one of the channels being coupled to an output node, and each one of the amplifiers being fed one of the n bits of the first digital word of one of the two pairs of digital words and n bits of the second digital word of said one of the two pairs of digital words; (D) wherein the phase shifter-attenuator section provide, in response to the two pairs of digital words fed thereto, a one of $2^m * 2^{(2n)}$ combinations of phase shift-attenuation states to the input signal over a selected one of a plurality of ranges of attenuations, such one of the combinations being selected in accordance with the 2n bit digital word, such one of the ranges being selected in accordance with the m bit digital word.

With such embodiment, a large range of variable gain/attenuation is achieved without losing phase accuracy. This combines the phase rotator with a coarse attenuator used externally, or by coarsely changing the gain of all states by modifying the current supplied to the circuit digitally. When these external methods are used to provide large (~10 dB) changes in attenuation, the fine control of the phase rotator is used to provide desired amplitude states at higher amplitude resolution within coarsely-tuned attenuation states.

The combination of a coarsely-tuned attenuator (or, in one embodiment, bias controller) to the intrinsic fine amplitude control of the phase rotator enables high phase resolution to be maintained over a wide range of attenuator values. Previous methods either fail to achieve a wide amplitude tuning range, or fail to maintain phase resolution as attenuation is increased. Two possible methods to achieve this function are described and include a combination of course and fine attenuation control, such that high phase resolution can be maintained over a wide tunable range of attenuator settings.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
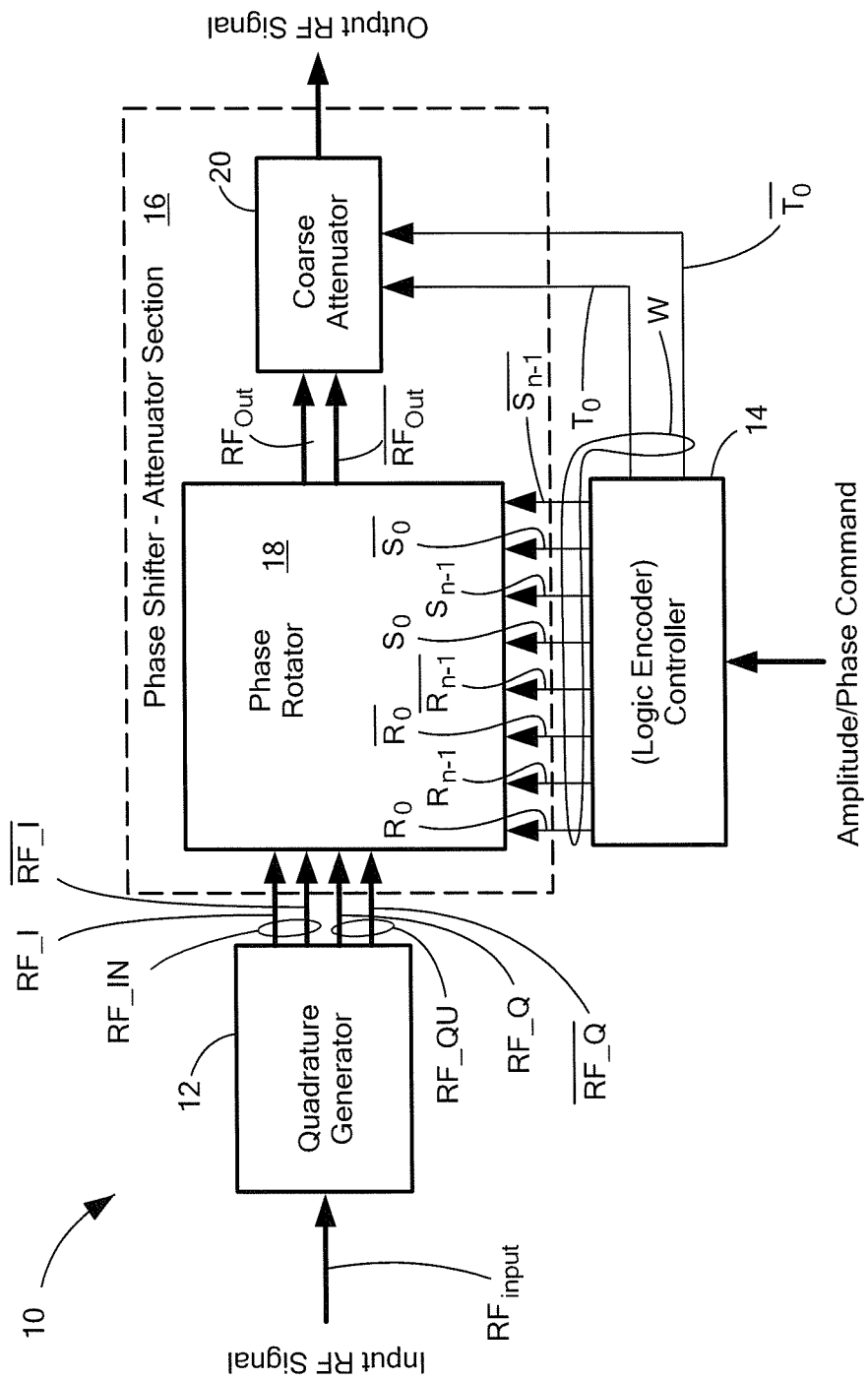
FIG. 1 is a block diagram of a phase shifter-attenuator system according to one embodiment.

Referring now to FIG. 1, a phase shifter-attenuator system 10 is shown having: a quadrature section 12 for separating an input signal $RF_{INPUT}$ into a corresponding pair of quadrature channels, one channel (the in-phase channel) having the signal RF_IN, and other channel (the out-of-phase channel, or quadrature channel) having the signal RF_QU with each one pair of quadrature signals having an "true" component and "complement" (or "inverted" component). Thus the in-phase channel RF_IN has true signal FR_I and complement signal, $\overline{RF}$_I while the quadrature channel RF_QU has the true signal RF_Q, and the complement signal $\overline{RF}$_Q.

The phase shifter-attenuation system 10 includes a controller 14 for producing a control signal, here a digital word W, representative of a predetermined phase shift and attenuation to be provided to an input signal $RF_{INPUT}$; and a phase shifter-attenuation section 14. The phase shifter-attenuation section 16 has an in-phase channel fed by the pair of in-phase signals and a quadrature channel fed by the pair of quadrature signals (FR_I, $\overline{RF}$_I, RF_Q, RF_Q) produced by the quadrature section 12.

The phase shifter-attenuation section 16 provides one of a plurality of combinations of phase shift-attenuation states to the input signal $RF_{INPUT}$ selectively in accordance with a 4n+2m bit digital word W produced by the controller 14, where n and m are integers. One portion of the produced digital word W, here the 4n bit portion (i.e., n true bits $R_0$ through n complement bits $\overline{R}_0$ through $\overline{R}_{n-1}$; n true bits $S_0$ through $S_{N-1}$; and n complement bits $\overline{S}_0$ through $\overline{S}_{n-1}$) is fed to a phase rotator 18 phase shifter-attenuation section 16 for produces $2^{(2n)}$ phase shift-attenuation states to be described in more detail in connection with FIG. 2A; and an attenuation section 20 in the phase shifter-attenuation section 16 distributes the plurality of combinations of phase shift-attenuation states over a selected range of attenuations, such range being selected in accordance with the second, 2m bit portion of the produced digital word W (i.e., m true bits $T_0$ through $T_{m-1}$ and m complement bits $\overline{T}_0$ through $\overline{T}_{m-1}$).

Figure 2A:
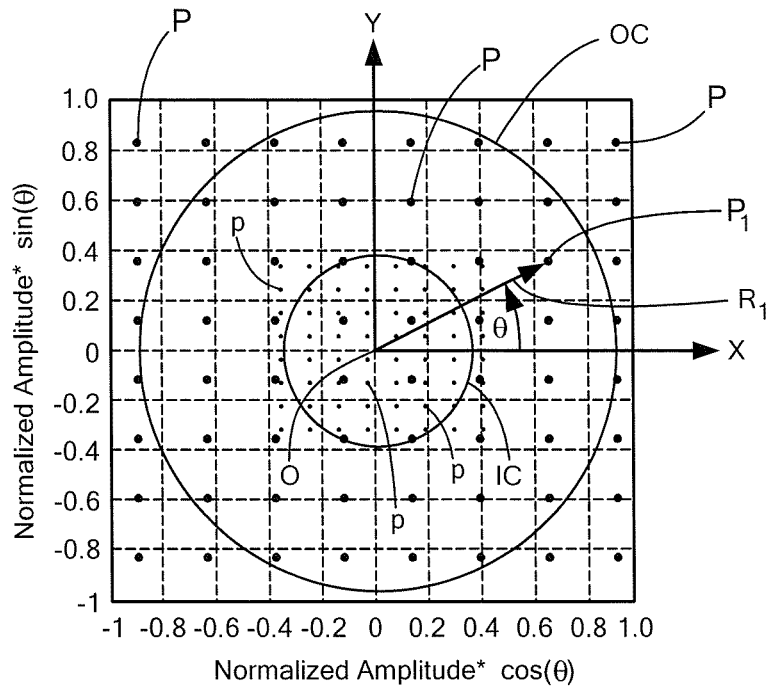
FIG. 2A shows two arrays of phase shift-attenuation states produced by the phase shifter-attenuation system of either FIG. 1 or FIG. 1A over two different ranges of attenuations.

Referring in more detail to FIG. 2A four quadrants of an X-Y Cartesian coordinate system having an origin O. The X-axis represents the amplitude of a signal produced in the in-phase channel of the phase shifter-attenuation section 16 and the Y-axis represents the amplitude of a signal produced in the quadrature channel of the phase shifter-attenuation section 16. As will be described, the phase rotator 18 produces phase shift-attenuator states in the X-Y Cartesian coordinate system.

Here, in this example, 2n is 6 and m is 1. Thus, the phase rotator 18 will produce one of 64-phase shift-attenuation states selected by the n bit portion of the word W and one of 2 ranges of attenuation selected by the m bit portion of the word W. Considering an exemplary one of the 64 states; here the state labeled P1. A vector R1 from the origin to point P1 has attenuation R1 and a phase shift Θ1. It is noted that, as will be described in more detail below, the phase shifter-attenuation section 16 operates with different selectable dynamic ranges; such range being selected by the attenuation section 20 in response to the m bit portion of the word W: A nominal dynamic range; and, one or more attenuated dynamic ranges. Here, in this example, consider that the phase shifter-attenuation section 16 operates with either the nominal dynamic range, indicated by the outer circle OC in FIG. 2A, or one attenuated dynamic range, indicated by the inner circle IC in FIG. 2A. In this example, FIG. 2A shows the phase shifter-attenuation states as points as larger points P when the phase shifter-attenuation section 16 is operating in the nominal dynamic range and shows the phase shifter-attenuation states as points smaller points p when the phase shifter-attenuation section 16 is operating in the attenuated dynamic range. It is noted that in either operating dynamic range the phase rotator 18 produces the same number of phase shifter-attenuation states (64 states in this example); however, when the phase shifter-attenuation section 16 is operating in the attenuated dynamic range the 64 states are all disposed located closer to the origins, i.e., closer to the range with the greatest attenuations. To put it another way, absent operation in the attenuated dynamic range, the number of available phase shift-attenuation states is much less that the number of available phase shift-attenuation states during the normal operating dynamic range. Thus, for larger attenuations, the operation of the phase shifter-attenuation section 14 in this attenuation dynamic range increases the number of available phase shift-attenuation states that can be provided by the phase shifter-attenuation section 16.

Figure 2B:
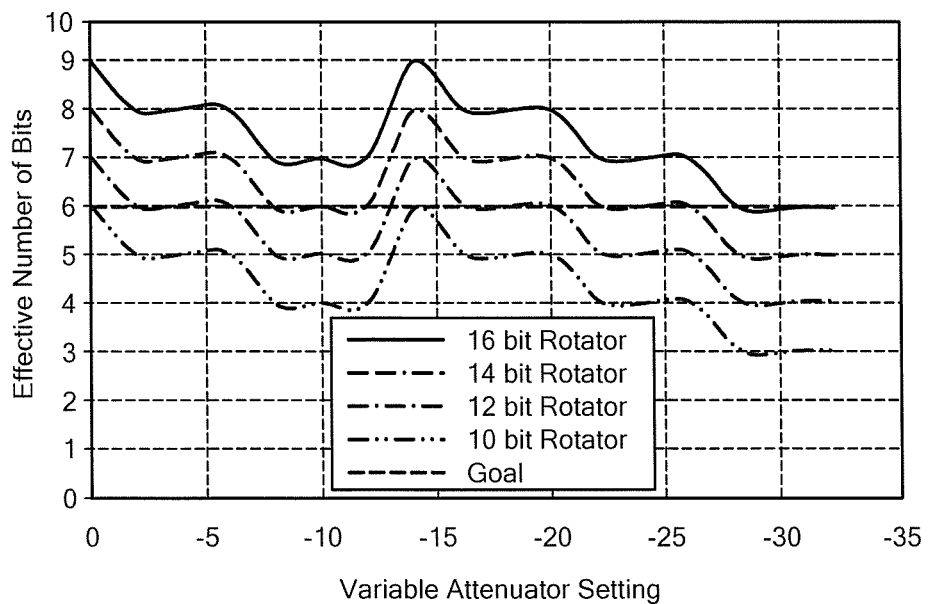
FIG. 2B are curves showing effective bit resolution as a function of selected attenuation range with the phase shifter-attenuation system of either FIG. 1 or FIG. 1A.

Thus, the inventors have noted that by having a selectable dynamic range, many more points (i.e., phase shift-attenuation states) are available thereby increasing the phase-shift-attenuation resolution. FIG. 2B represents this data in an alternative way, showing improvement to phase resolution over selected amplitude. At approximately 13 dB, the attenuator is activated to shift the region of phase resolution, making it possible to maintain at least 6 bits of phase resolution with a 14-bit phase rotator up to a gain attenuation of 27 dB.

The controller 14 is for example a read only memory that stores the relationship between gain and attenuation desired for the input signal and control signal for the phase shifter-attenuator system 10. As noted above, the digital word W produced by controller 14 has two portions; one portion is an 4n bit digital word representative of the selected one of the 64 phase shift-attenuation states is fed to the phase rotator 18 and a second portion is a 2m bit digital word representative of the selected dynamic range of the phase shifter-attenuation section 14 fed to the attenuator section 20.

The discussion below will consider a more general case where there are $2^{(2n)}$ phase shift-attenuation states and m attenuation ranges. Here the control signals (i.e., the digital word W) has 4n+2m bits; 2n bits for the in-phase channel of the phase rotator 18 (i.e., n true bits $R_0$ through $R_{n-1}$ and n complement bits $\overline{R}_0$ through $\overline{R}_{n-1}$ and 2n bits for the quadrature channel of the phase rotator 18 (i.e., n true bits $S_0$ through $S_{N-1}$ and n complement bits $\overline{S}_0$ through $\overline{S}_{n-1}$) and 2m bits for the attenuator 20 (true bits $T_0$ through $T_{m-1}$ and complement bits $\overline{T}_0$ through $\overline{T}_{m-1}$).

Figure 3:
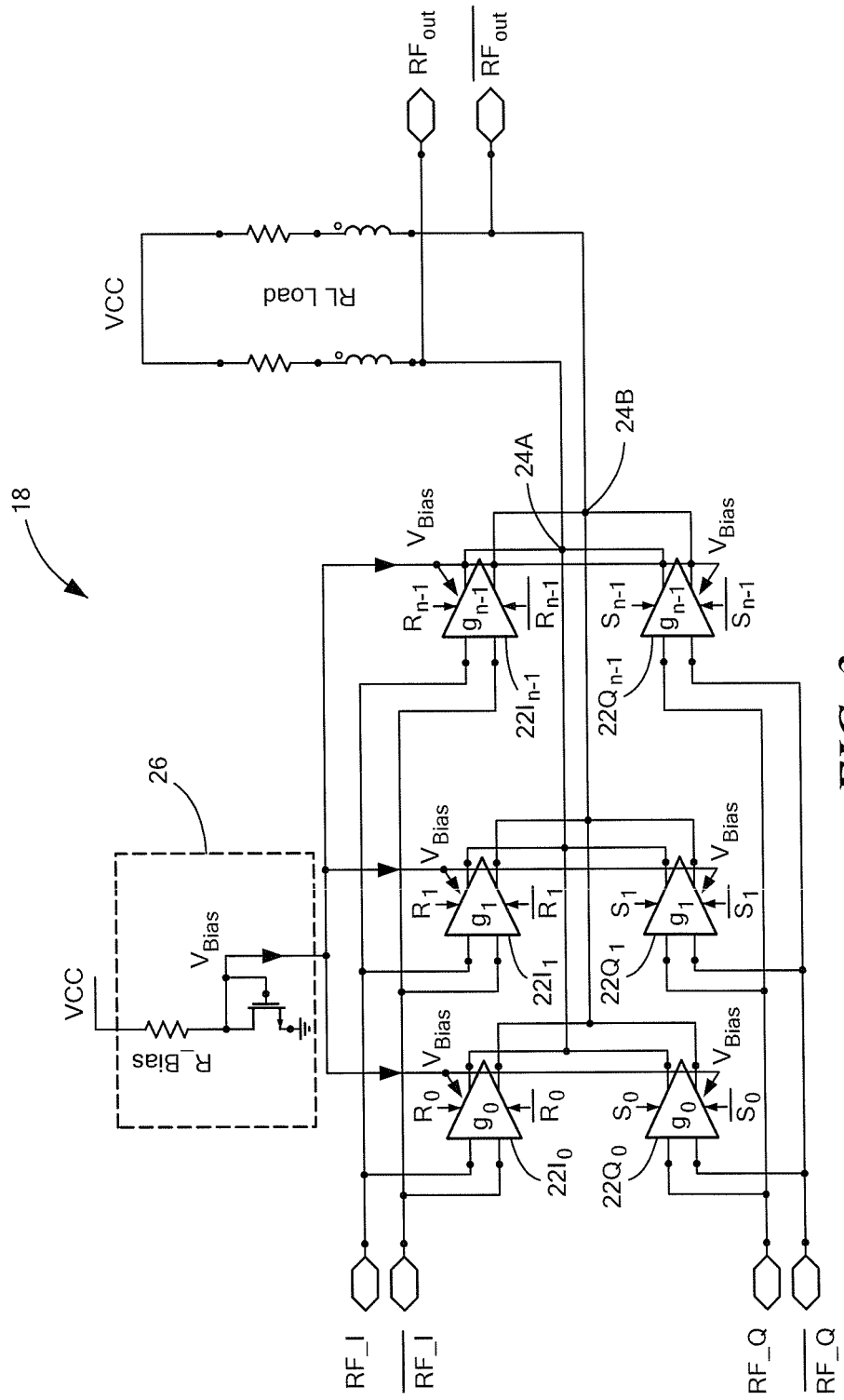
FIG. 3 is a block diagram of a phase rotator used in the phase shifter-attenuation system of FIG. 1.

Referring now to FIG. 3, the phase rotator 18 has a pair of quadrature channels, each one of the channels being fed a corresponding one of the pair of quadrature signals FR_I, RF_I and RF_Q, $\overline{RF}\_Q$ produced by the quadrature generator 12. Each one of the channels has (i) a plurality of n amplifiers $22I_0$ through $22I_{n-1}$ and $22Q_0$ through $22Q_{n-1}$, respectively, as indicated. Each one the amplifiers $22I_0$ through $22I_{n-1}$ and $22Q_0$ through $22Q_{n-1}$ has a different gain $g_0$ through $g_{n-1}$, respectively as indicated.

Each one of the amplifiers $22I_0$ through $22I_{n-1}$ and $22Q_0$ through $22Q_{n-1}$ is fed by the corresponding one of the pair of quadrature signals FR_I, $\overline{RF}\_I$ and RF_Q, $\overline{RF}\_Q$. Thus, more particularly, amplifiers $22I_0$ through $22I_{n-1}$ is each fed signals FR_I and $\overline{RF}\_I$ and amplifiers $22Q_0$ through $22Q_{n-1}$, is each fed and signals RF_Q and $\overline{RF}\_Q$, as indicated.

Each one of amplifiers $22I_0$ through $22I_{n-1}$ and $22Q_0$ through $22Q_{n-1}$ produces a pair of quadrature RF output signals RFout and $\overline{RFout}$. The in-phase signals RFout produced by the amplifiers $22I_0$ through $22I_{n-1}$ and $22Q_0$ through $22Q_{n-1}$ are combined at output node $24_A$ and the out of phase signals $\overline{RFout}$ produced by the amplifiers $22I_0$ through $22I_{n-1}$ and $22Q_0$ through $22Q_{n-1}$ are combined node $24_B$ as indicated in FIG. 3.

Referring again to FIG. 3, the amplifiers $22I_0$ through $22I_{N-1}$ are fed the n true bits $R_0$ through $R_{n-1}$ and n complement bits $\overline{R}_0$ through $\overline{R}_{N-1}$, respectively, as indicated. Thus, amplifier $22I_0$ is fed true bit $R_0$ and also complement bit $\overline{R}_0$; amplifier $22I_1$ is fed true bit $R_1$ and also complement bit $R_1$; . . . and amplifier $22I_{n-1}$ is fed true bit $R_{n-1}$ and also complement bit $\overline{R}_{n-1}$. Likewise, the amplifiers $22Q_0$ through $22IQ_{n-1}$ are fed the n true bits $S_0$ through $S_{n-1}$ and n complement bits $\overline{S}_0$ through $\overline{S}_{N-1}$, respectively, as indicated. Thus, amplifier $22Q_0$ is fed true bit $S_0$ and also complement bit $\overline{S}_0$; amplifier $22Q_1$ is fed true bit $S_1$ and also complement bit $S_1$; . . . and amplifier $22Q_{n-1}$ is fed true bit $S_{n-1}$ and also complement bit $\overline{S}_{n-1}$.

Thus, for practical control of amplitude variability and phase shift, the amplifier portion of the phase rotator consists of a number, n, of fixed amplifiers $22I_0$ through $22I_{n-1}$ and $22Q_0$ through $22Q_{n-1}$, here transconductance amplifiers with geometrically-increasing gains. An exemplary one of the amplifiers $22I_0$ through $22I_{n-1}$ and $22Q_0$ through $22Q_{n-1}$, here amplifier $22I_0$ is shown in detail in FIG. 4.

To provide the variable gain for the in-phase (I) and quadrature (Q) channels, each fixed amplifier $22I_0$ through $22I_{n-1}$ and $22Q_0$ through $22Q_{n-1}$ is digitally configured to either provide the fixed amplification with no sign (i.e., zero phase shift) change, or to provide the same level of amplification while changing the sign of the signal (180 degree phase shift). The currents from all amplifiers are, as noted above, summed at two differential nodes $24_A$ and $24_B$ (FIG. 3) and ultimately converted into a voltage by a passive load (typically a resistor, inductor, or combination of other passive elements, as indicated). Additional amplifiers may be added to increase the phase resolution of the phase rotator, but the geometric scaling of the fixed gains must be maintained to provide linear and monotonic operation.

By inverting the sign of the amplified signal, the amplifier will supply a current that decreases the overall current associated with the signal on that path, but has no effect on the signal level of the quadrature path. For example, if the highest-gain amplifier of the I-path was configured with a positive sign but all other I-path amplifiers are configured with negative signs, the total current associated with the I-path will be minimized. While the Q-path amplifiers connect to the same current summation node, they will not be affected by the change in I-path amplitude because the offset phase in current will neither constructively nor destructively combine. This principle enables the scaled vector summation that makes phase rotation possible.

Figure 4:
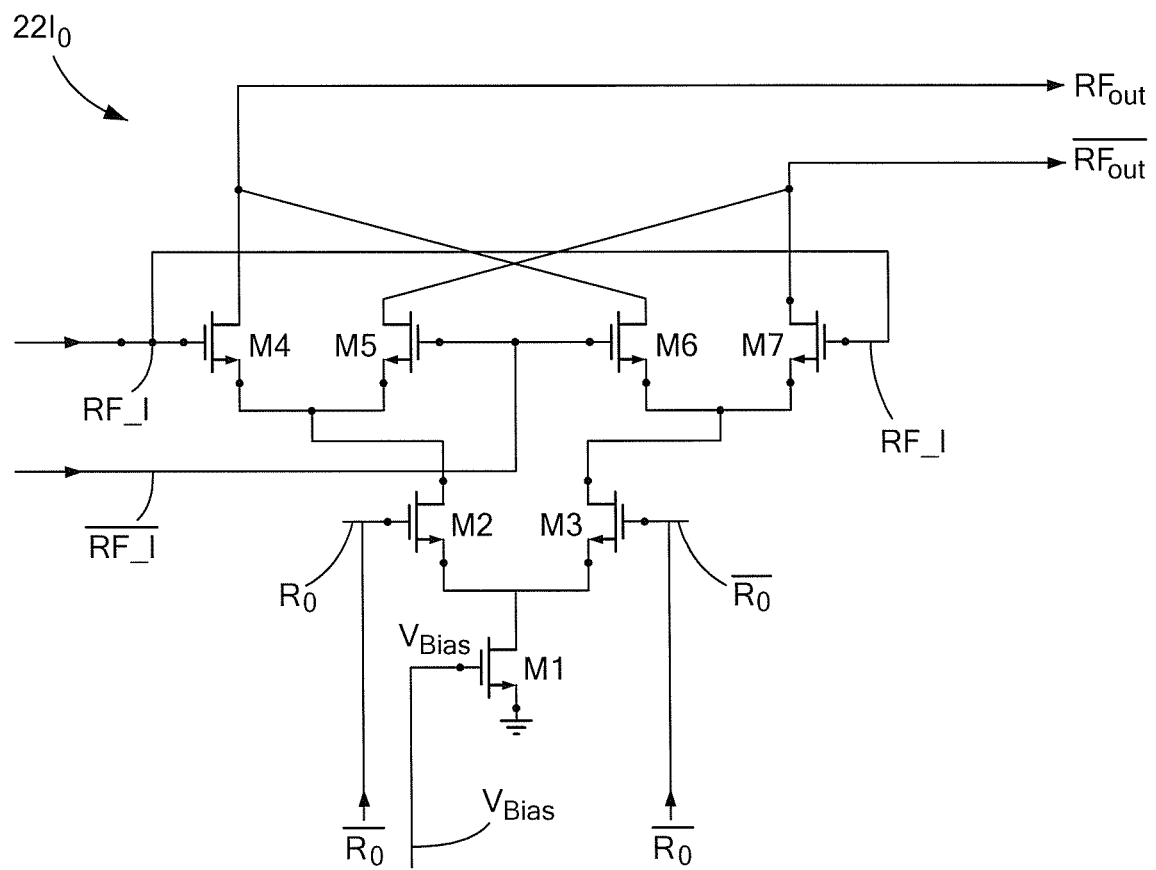
FIG. 4 is a schematic diagram of an exemplary one of a plurality of amplifiers used in the phase rotator of FIG. 3 or FIG. 3A.

FIG. 4 shows a typical circuit configuration for an amplifier bit that allows a digitally-programmable sign change; here amplifier $22I_0$. In this circuit, a tail current is generated by transistor M1 with a voltage defined by the bias circuit 26. This current is steered either to the left branch by supplying a high voltage to the gate of M2 (hence opening its channel), or steered to the right branch by supplying a high voltage to the gate of M3. The digital control signal bit $R_0$ is inverted (i.e., its complement $\overline{R}_0$) for the other branch, to ensure the channel is fully closed for the unused branch. The positive side of the differential input signal connects to the gates of both M4 and M7, while the negative side connects to the gates of both M5 and M6. Because these devices control the gain of the amplifier bit, all four devices are designed to be as closely matched as possible in size, routing, and other parasitics. If the left branch is selected by providing a high voltage to M2, the current at RFout is determined by the gain of device M4 and is driven by the positive side of the input signal. The current at $\overline{RFout}$ is driven by the negative side of the input signal, forming a differential amplifier between the two sides of the same branch. The unused branch contributes no current to the outputs, as all current has been steered to the active branch.

To achieve a sign change, devices M2 and M3 are configured to steer all current through the right branch by providing a high voltage to the gate of M3. In this case, device M7 is now connected to the high side of the input signal, but the output of this device is connected to the negative output. Conversely, the negative side of the input signal is connected to M6 and ultimately the positive output. Because all gain devices are matched and they contribute no current when the branch is unused, the effective result is a fixed-gain amplifier with a digitally-selectable sign change.

To achieve gains based on a geometrical increase from the smallest-gain bit, the tail current device M1 and gain devices M4-M7 are scaled appropriately to achieve the desired fixed gain. Because the differences in gate widths between the various bits can be large, it is preferred to scale the lengths of the gate fingers of the device instead of the width to maintain linear scaling of parasitics.

As noted above in connection with FIG. 2A, in order to achieve a large range of variable gain/attenuation without losing phase accuracy, the phase rotator 18 having the amplifiers fed a fixed bias voltage $V_{Bias}$ circuit 26 is combination with a switchable attenuator 20 used either externally (as shown in FIG. 1), or by coarsely changing the gain of all states by modifying with a switchable bias voltage $V_{bias}$ for the amplifiers to be described in connection with the embodiment shown in FIG. 1A. When these external methods are used to provide large (~10 dB) changes in attenuation, the fine control of the phase rotator is used to provide desired amplitude states at higher amplitude resolution within the coarsely-tuned states.

In this embodiment (FIG. 1), all the amplifiers $22I_0$ through $22I_{n-1}$ and $22Q_0$ through $22Q_{n-1}$ are fed a common fixed bias voltage $V_{Bias}$ produced by a bias circuit 26 (FIG. 3). The output of the phase rotator 18 is fed to the switchable attenuator 20 (FIG. 5A). Here, a single bit attenuator is shown (i.e., m=1, have bits $T_0$ and $\overline{T}_0$) with MOSFET devices forming the series and shunt resistive regions. When activated into the low attenuation state (i.e., the phase shifter-attenuation section 16 (FIG. 1) operates in the low attenuation condition shown by the outer circle OC in FIG. 2A), the series devices FET1 and FET2 are "on" passing the signal with only minimal attenuation while FET3 is "off" and provides a resistive match to the characteristic impedance of the adjacent circuits. When the attenuator is in the high attenuation condition (i.e., the phase shifter-attenuation section 16 (FIG. 1) operates in the high attenuation condition shown by the inner circle IC in FIG. 2A), FET1 and FET2 are "off" and FET3 is "on". The in-phase and quadrature signals are combined in amplifier 21.

Figure 5:
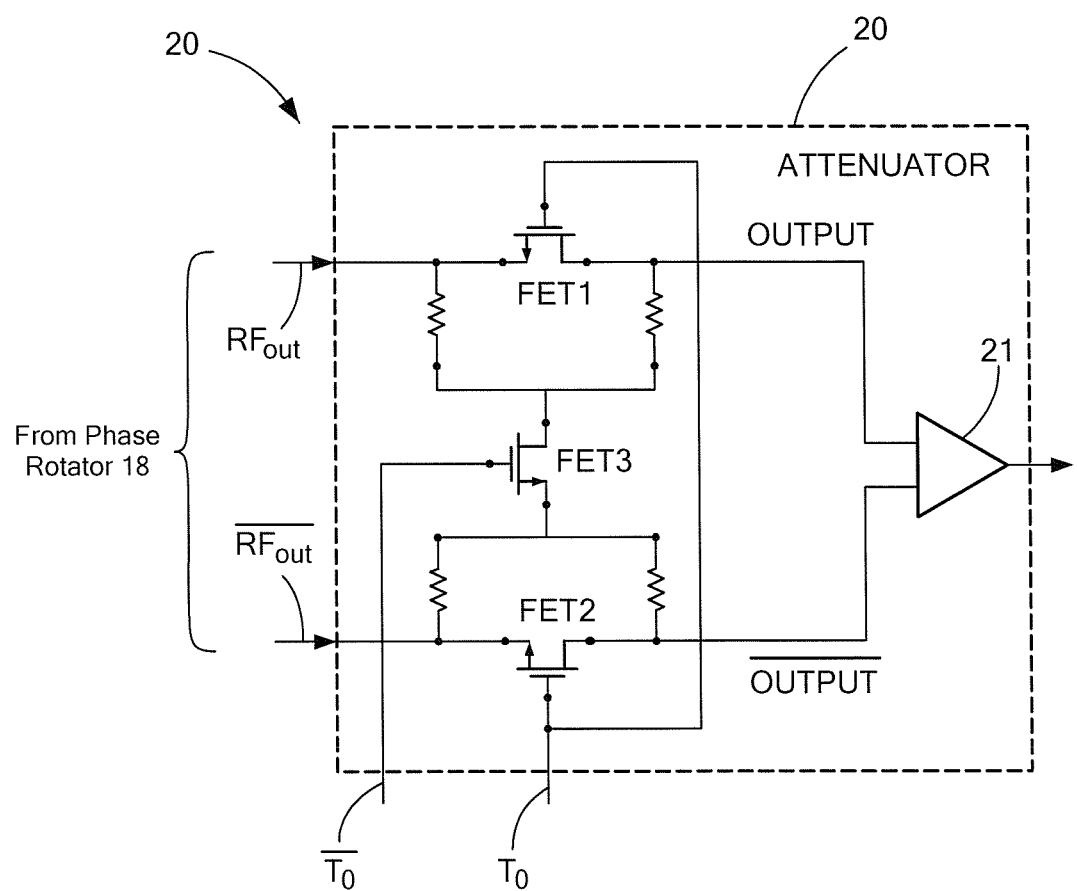
FIG. 5 is a schematic diagram of an attenuator fed by the phase rotator of FIG. 3.
Figure 5A:
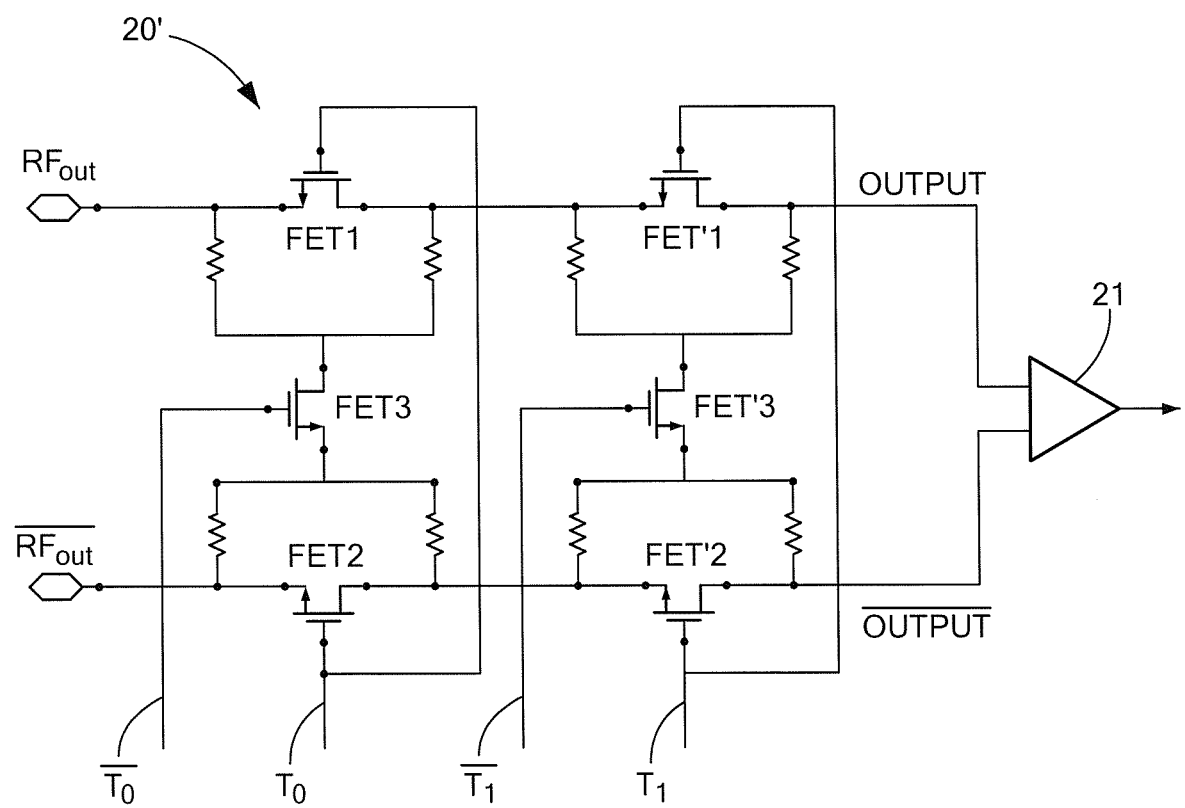
FIG. 5A is a schematic diagram of an alternative embodiment of an attenuator fed by the phase rotator of FIG. 3.

FIG. 5B shows an attenuator 20'; with two digitally-selectable states (i.e., m=2). Referring now to FIG. 1B, a phase shifter-attenuator system 10A is shown having: the quadrature section 12 for separating an input signal $RF_{INPUT}$ into a corresponding pair of quadrature channels and the controller 14 for producing a control signal, here a digital word W, representative of a predetermined phase shift and attenuation to be provided to an input signal $RF_{INPUT}$; and a phase shifter-attenuation section 14. The phase shifter-attenuation section 16A has an in-phase channel fed by the pair of in-phase signals and a quadrature channel fed by the pair of quadrature signals (FR_I, $\overline{RF}\_I$, RF_Q, $\overline{RF}\_Q$) produced by the quadrature section 12.

The phase shifter-attenuation section 16A provides one of a plurality of combinations of phase shift-attenuation states to the input signal $RF_{INPUT}$ selectively in accordance with a 4n+2m bit digital word W produced by the controller 14, where n and m are integers. One portion of the produced digital word W, here an the 4n bit portion (i.e., n true bits $R_0$ through $R_{n-1}$; n complement bits $\overline{R}_0$ through $\overline{R}_{n-1}$; n true bits $S_0$ through $S_{N-1}$; and n complement bits $\overline{S}_0$ through $\overline{S}_{n-1}$) is fed to a phase rotator section 18A (FIG. 3A) phase shifter-attenuation section 16A and produces $2^{(2n)}$ phase shift-attenuation states as described above in connection with FIG. 2A. It is noted that here the phase rotator section 18A does not have a fixed bias circuit 26 for the amplifiers $22I_0$ through $22I_{n-1}$ and $22Q_0$ through $22Q_{n-1}$; rather the bias voltage $V_{bias}$ is a switchable voltage provided by the attenuator 20A. The switchable bias point switches the operating point and hence the dynamic range of the amplifiers $22I_0$ through $224I_{n-1}$ and $22Q_0$ through $22Q_{n-1}$. More particularly, the attenuation section 20A of the phase shifter-attenuation section 16A distributes the plurality of combinations of phase shift-attenuation states over a selected range of attenuations, such range being selected in accordance with the second, m bit portion of the produced digital word W ($T_m$). Here, the attenuation section 20A changes the attenuation or dynamic range of the phase shifter-attenuation section 16A by switching the bias voltage fed to the amplifiers $22I_0$ through $22I_{n-1}$ and $22Q_0$ through $22Q_{n-1}$ selectively in response to the 2m bit portion of the digital word W. Thus, with one bias voltage level ($V_{bias}$) the phase shifter-attenuation section 16A operates to provide phase shift-attenuation states in the inner circle IC of FIG. 2A and with another bias voltage level the phase shifter-attenuation section 16A operates to provide phase shift-attenuation states in the outer circle OC of FIG. 2A. It is noted that the switchable bias voltage ($V_{bias}$) is sent to all amplifiers $22I_0$ through $22I_{n-1}$ and $22Q_0$ through $22Q_{n-1}$ within the phase rotator 18A, and scales the individual bit gains proportionally. This has the effect of changing the coarse gain provided by each section, producing the same desirable coarse tuning effect without relying on changes in the phase rotator bit configuration.

Figure 6A:
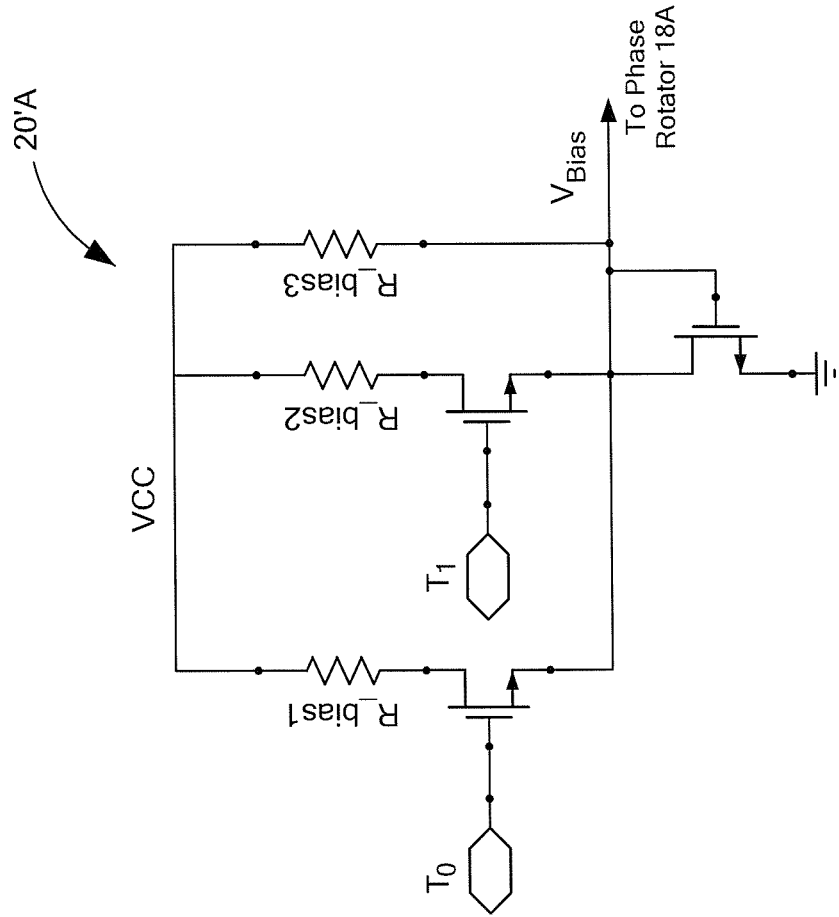
FIG. 6A is a schematic diagram of an alternate embodiment of an attenuator for the phase rotator of FIG. 3A.
Figure 6:
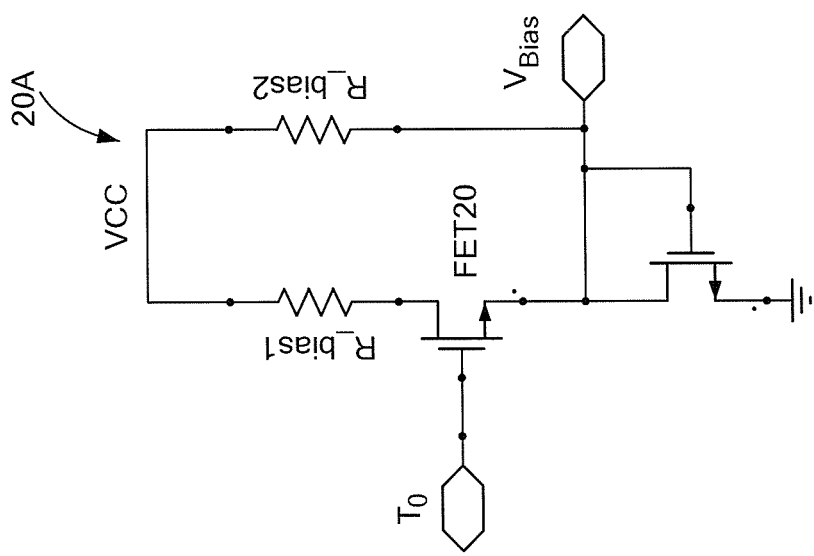
FIG. 6 is a schematic diagram of an attenuator for the phase rotator of FIG. 3A.

Referring now to FIG. 6, a one-bit attenuator 20A is shown. When FTE 20 is "on", a relatively high bias voltage ($V_{bias}$) is produce and the phase shifter-attenuation section 16A operates in the normal condition with the phase shift-attenuation states being within the outer circle OC of FIG. 2A and when FET 20 is "off" a lower voltage ($V_{bias}$) is produced and the phase shifter-attenuation section 16A operates in the attenuation condition with the phase shift-attenuation states being within the inner circle IC of FIG. 2A. A two bit attenuator 20A' is shown in FIG. 6A for producing three levels of bias voltage.'

Figure 1A:
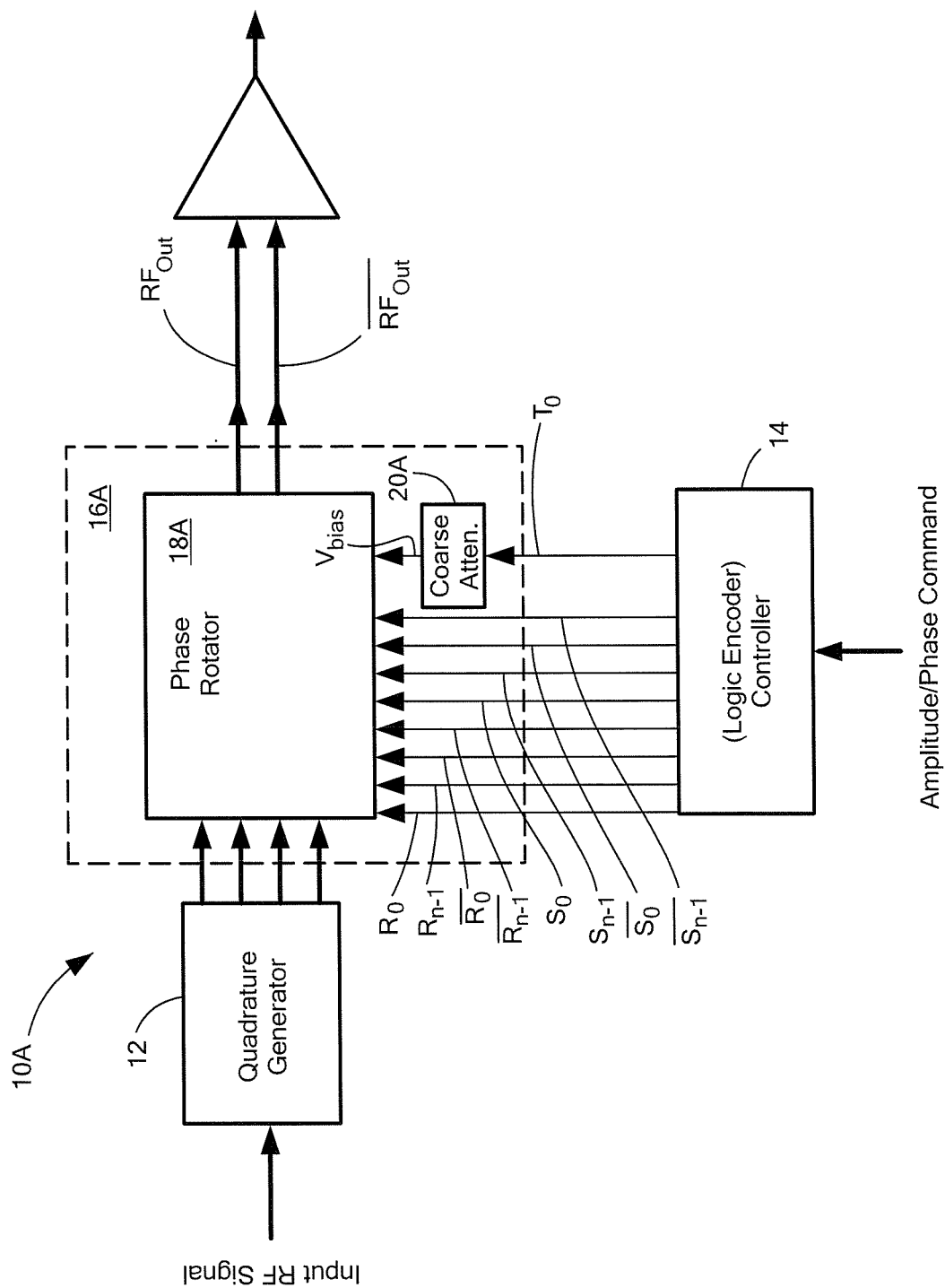
FIG. 1A is a block diagram of a phase shifter-attenuator system according to another embodiment.
Figure 3A:
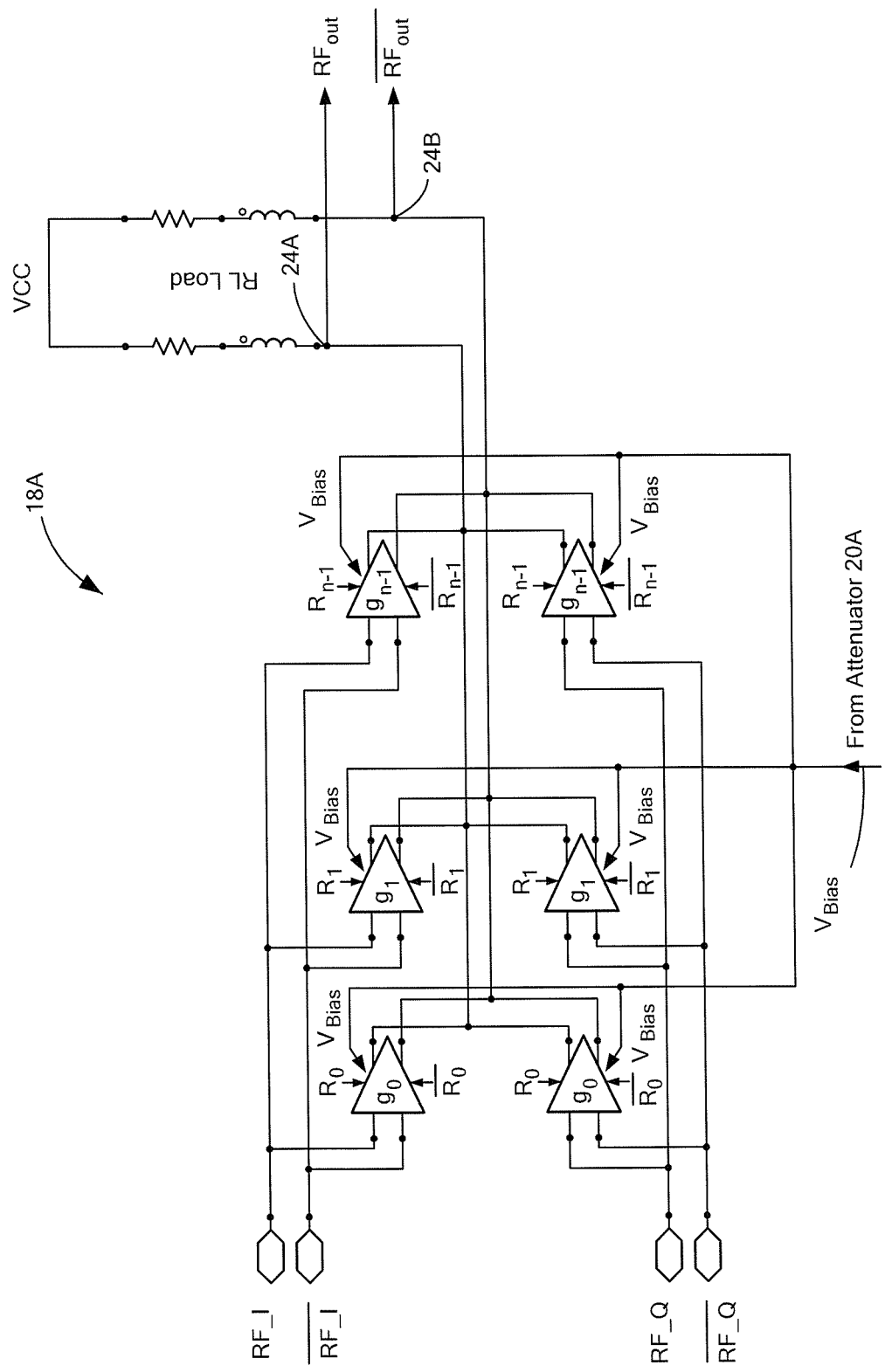
FIG. 3A is a block diagram of a phase rotator used in the phase shifter-attenuation system of FIG. 1A.
Figure 3B:
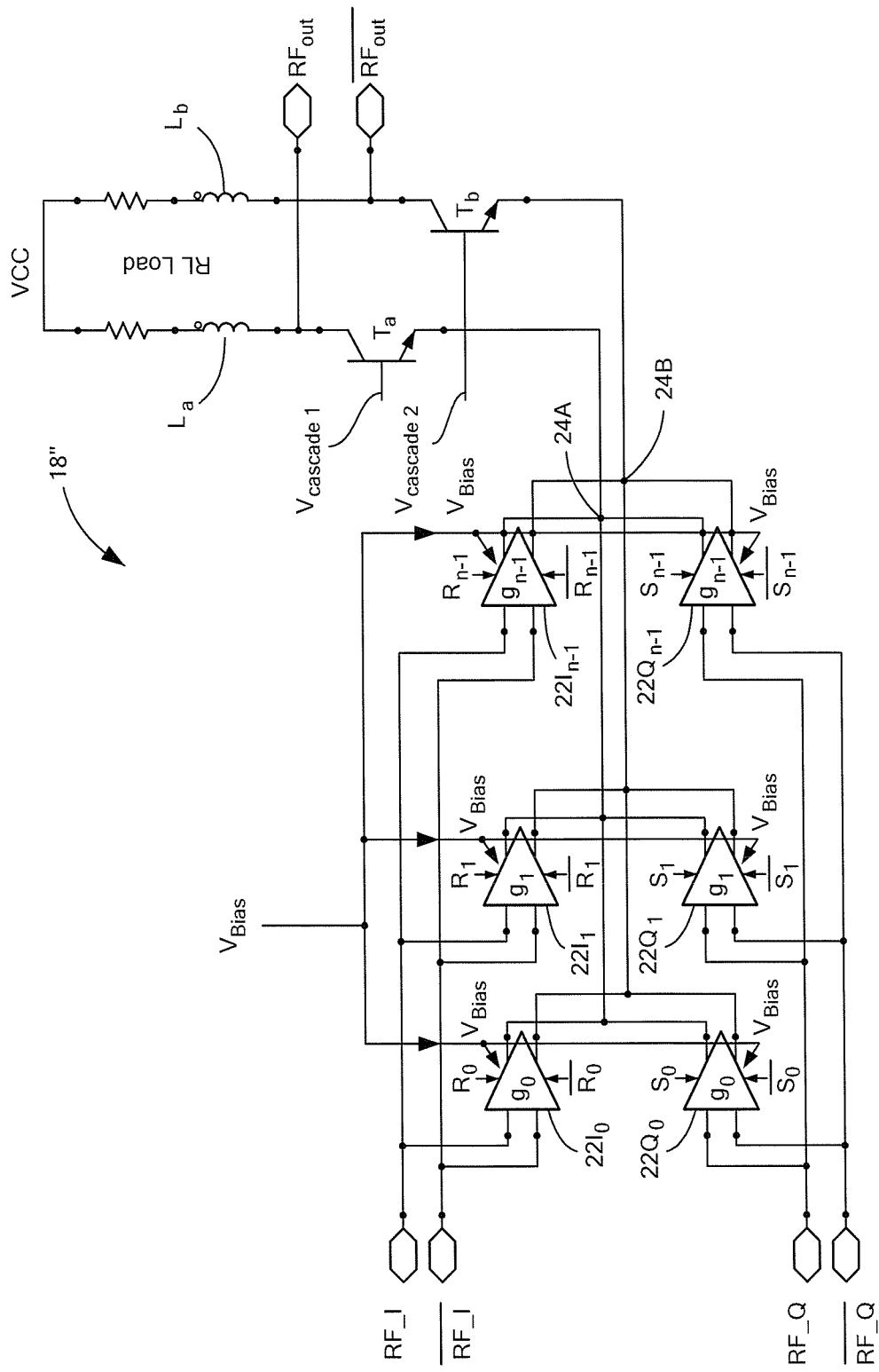
FIG. 3B is a block diagram of a phase rotator according to another embodiment adapted for use in the phase shifter-attenuation system of FIG. 1 or 1A.

Referring now to FIG. 3B, a phase rotator 18" is shown adapted for use in the phase shifter-attenuation system of FIG. 1 or FIG. 1A or in a system without dynamic range selection. Here the phase rotator 18" has a pair of cascode transistors Ta, Tb, respectively, between nodes 24A and 24B and the Loads La, Lb, as shown. These transistors are provided to limit the voltage swing at the nodes 24A and 24B.

More particularly, while the circuit topology described in FIGS. 3 and 3A produce the desired phase and amplitude controls, it has a limited range of linear behavior. Because the gain stages (i.e., amplifiers $22I_0$ through $22I_{n-1}$ and $22Q_0$ through $22Q_{n-1}$) of the fixed-gain bits are all exposed to the full voltage swing at the summed node, 22A, 2B, in FIGS. 3 and 3A, the output power must remain sufficiently low to keep voltage operation of the gain devices within their linear regions.

While, in order to improve the linearity of a typical amplifier that is limited by the output voltage swing, a cascode configuration is often used, if such were to be applied to the circuits in FIGS. 3 and 3A, a cascode amplifier would be used at the output of each one of the amplifiers $22I_0$ through $22I_{n-1}$ and $22Q_0$ through $22Q_{n-1}$. More particularly, the use of an additional active device at the output of each amplifiers to isolate the gain device from the large voltage swing on the output by acting as a current buffer following the transconductance amplifier. In addition to allowing higher output swing voltages, the cascode configuration increases the maximum bandwidth of operation by dramatically reducing the Miller feedback capacitance from the gain stage FET's drain to gate.

While the cascode configuration should benefit the output voltage swing and frequency response of the phase rotator, in practice it is faced with problems that deteriorate the benefits to the approach. Because of the large numbers of gain stages (i.e., amplifiers) associated with each of multiple bits within a phase rotator, the number of cascode devices is similarly large. To gain the benefits of the cascode configuration, these cascode devices also must be sufficiently large to enable high output linearity. This large size greatly increases the physical dimensions of each amplifier bit, leading to a significant increase in capacitive coupling to the substrate and other parasitics.

The inventors have recognized that one does not need a cascode amplifier Ta, Tb at the output of each one of the amplifiers $22I_0$ through $22I_{n-1}$ and $22Q_0$ through $22Q_{n-1}$, but rather that only one cascode amplifier is required at the output of each one of the summing nodes 22A, 22B, as shown in FIG. 3C. With the arrangement shown in FIG. 3B, however, the output currents from the variable transconductance core (i.e., amplifiers $22I_0$ through $22I_{n-1}$ and $22Q_0$ through $22Q_{n-1}$) of the phase rotator are first summed together at Nodes 22A and 22B, respectively. The rotator circuit is then treated as a single gain device and used with the cascode configuration Ta, Tb to provide increased frequency response with higher output voltage swing. However, the output signal is now taken between the cascode devices Ta, Tb and the load passives La, Lb, respectively as indicated, instead of directly from the summation nodes 22A, 22B. Using this arrangement, the voltage swings at the phase rotator summation nodes 22A, 22B are minimized. Because these nodes 22A, 22B contain all of the routing between each gain bit, the significantly-reduced voltage swing decreases the parasitics typically associated with the complex routing structures. A single pair of cascode devices Ta, Tb may now be used to complete the rotator, also reducing parasitics associated with these large devices and the corresponding metal routing. Using a cascode configuration only after current summation treats the bottom portion of the cascode as an active device with complex phase and amplitude characteristics and the top portion of the cascode as a transconductance buffer. This minimizes voltage swing on the summation node, greatly reducing the parasitic effects associated with using the cascode configuration at the gain amplifier node. The minimal voltage swing on the gain device output allows significant gain to be used without limiting the output swing, in turn enabling degeneration of the gain stage to increase the input linearity. This combination provides both high input linearity, and high output linearity with gain.

A number of embodiments of the disclosure have been described. Nevertheless, it will be understood that various modifications may be made without departing from the spirit and scope of the disclosure. For example, while two different methods are described to achieve the coarse attenuation control, other methods may be used. Accordingly, other embodiments are within the scope of the following claims.

What is claimed is:

1. A phase shifter-attenuator system, comprising:
   (A) a quadrature section for converting an input signal into a corresponding pair of quadrature signals with each one pair of quadrature signals having an in-phase component and an out-of-phase component;
   (B) a controller for producing a digital word representative of a predetermined phase shift and attenuation provided to the input signal;
   (C) a phase shifter-attenuator section fed by the produced digital word, comprising:
      a pair of quadrature channels, each one of the channels being fed a corresponding one of the pair of quadrature signals, each one of such channels having:
         a plurality of amplifiers, each one the amplifiers having a different gain, each one of the amplifiers being fed by the corresponding one of the pair of quadrature signals fed to such one of the channels, the amplifiers in such one of the channels being coupled to an output node;
   (D) wherein the phase shifter-attenuator section provides one of a plurality combinations of phase shift-attenuation states to the input signal selectively in accordance with one portion of the produced digital word, the combinations being distributed over a selected range of four quadrants of a phase shift-attenuation states array, the range being selected in accordance with a second portion of the digital word.

2. A phase shifter-attenuator system, comprising:
   (A) a quadrature section for converting an input signal into a corresponding pair of quadrature signals with each one pair of quadrature signals having an in-phase component and an out-of-phase component;
   (B) a controller for producing an two pairs of 2N bit digital words and a pair of M bit digital word, where N and M are integers, one of the pairs of 2N bit digital words being a first word $W_I$ having N bits and the complement of the first word, $\overline{W}_I$ having N bits, and the other one of the two pairs of 2N bit digital words being a second word $W_Q$ having N bits, and the complement of the second word, $\overline{W}_Q$, having N bits, such 2N+M bit digital words being representative of a predetermined phase shift and attenuation provided to the input signal;
   (C) a phase shifter-attenuator section fed by the two pairs of 2N bit digital words and a pair of M bit digital word, comprising:
      a pair of quadrature channels, each one of the channels being fed a corresponding one of the pair of quadrature signals, each one of such channels having:

a plurality of N amplifiers, each one the amplifiers having a different gain, each one of the amplifiers being fed by the corresponding one of the pair of quadrature signals fed to such one of the channels, each one of amplifiers in such one of the channels being coupled to an output node, and each one of the amplifiers being fed one of the 2N bits of the first digital word of one of the two pairs of digital words and 2N bits of the second digital word of said one of the two pairs of digital words;

(D) wherein the phase shifter-attenuator section provide, in response to the two pairs of digital words fed thereto, a one of $2^M * 2^{(2N)}$ combinations of phase shift-attenuation states to the input signal over a selected one of a plurality of ranges of phase shift-attenuation states, such one of the combinations being selected in accordance with the 2N bit digital word, such one of the ranges being selected in accordance with the M bit digital word.

3. The phase shifter-attenuator system recited in claim 1 wherein the amplifiers in such one of the channels is coupled to a corresponding one of a pair of the output nodes; and including: a pair of loads; and a pair of cascode arranged transistors, each one of the transistors being coupled between a corresponding one of the output nodes and a corresponding one of the loads.

* * * * *